United States Patent [19]
Johnson

[11] Patent Number: 5,888,849
[45] Date of Patent: Mar. 30, 1999

[54] METHOD FOR FABRICATING AN ELECTRONIC PACKAGE

[75] Inventor: Eric Arthur Johnson, Greene, N.Y.

[73] Assignee: International Business Machines Corporation, Armonk, N.Y.

[21] Appl. No.: 833,478

[22] Filed: Apr. 7, 1997

[51] Int. Cl.[6] .......................... H01L 21/44; H01L 21/48; H01L 21/50

[52] U.S. Cl. ................... 438/126; 438/108; 438/118; 438/125

[58] Field of Search .................... 438/126, 108, 438/118

[56] References Cited

U.S. PATENT DOCUMENTS

| | | | |
|---|---|---|---|
| 4,677,528 | 6/1987 | Miniet | 361/398 |
| 4,837,184 | 6/1989 | Lin et al. | 437/217 |
| 5,041,396 | 8/1991 | Valero | 438/126 |
| 5,045,921 | 9/1991 | Lin et al. | 357/74 |
| 5,064,706 | 11/1991 | Ueda et al. | 428/131 |
| 5,075,760 | 12/1991 | Nakashima et al. | 357/70 |
| 5,170,328 | 12/1992 | Kruppa | 361/398 |
| 5,352,633 | 10/1994 | Abott | 437/211 |
| 5,365,655 | 11/1994 | Rose | 438/124 |
| 5,386,339 | 1/1995 | Polinski, Sr. | 361/719 |
| 5,390,079 | 2/1995 | Aomori et al. | 361/749 |
| 5,447,886 | 9/1995 | Rai | 438/108 |
| 5,450,283 | 9/1995 | Lin et al. | 361/704 |
| 5,602,059 | 2/1997 | Horiuchi et al. . | |
| 5,639,695 | 6/1997 | Jones et al. | 438/126 |
| 5,661,086 | 8/1997 | Nakashima et al. | 438/118 |
| 5,661,088 | 8/1997 | Tessier et al. | 438/126 |

FOREIGN PATENT DOCUMENTS 62-224033  10/1987  Japan .............................. H01L 21/60

OTHER PUBLICATIONS

Anon, "Polyimide Preform for Polyimide Film Chip Carrier", *Research Disclosure*, Nov. 1987, No. 283.

*Primary Examiner*—Kevin M. Picardat
*Assistant Examiner*—Deven Collins
*Attorney, Agent, or Firm*—Pollock, Vande Sande & Amernick; Lawrence R. Fraley

[57] ABSTRACT

An electronic package is fabricated by providing a thin, circuitized substrate having electrical circuitry on a first surface; and then molding a dielectric body to the first surface of the substrate. The dielectric body contains an opening for exposing a portion of the surface of the thin circuitized substrate having at least a portion of the electrical circuitry. A semiconductor device is then positioned within the opening of the molded dielectric body and is electrically coupled to at least a portion of the electrical circuitry on the exposed portion of the surface of the thin circuitized substrate. Next, a plurality of electrical conductive members are secured to a surface of the thin circuitized substrate that is opposite the first surface.

20 Claims, 4 Drawing Sheets

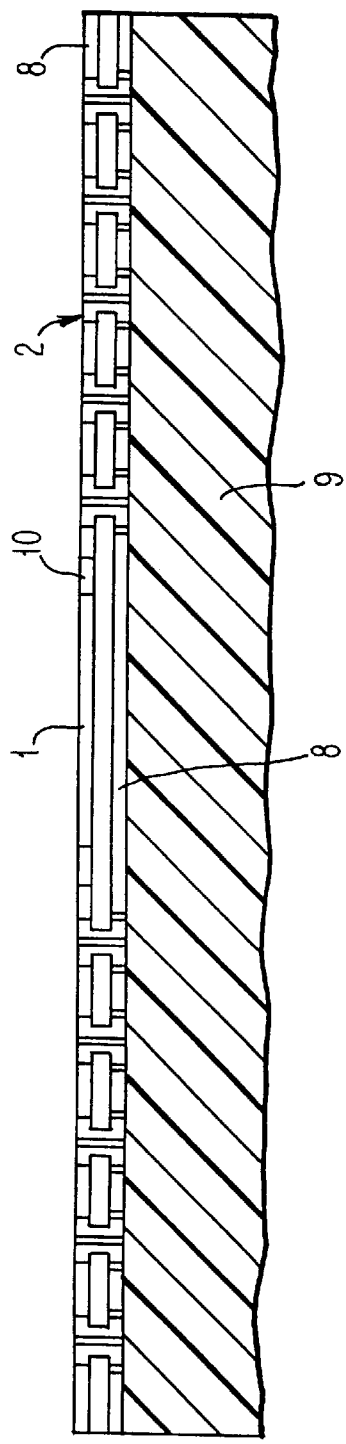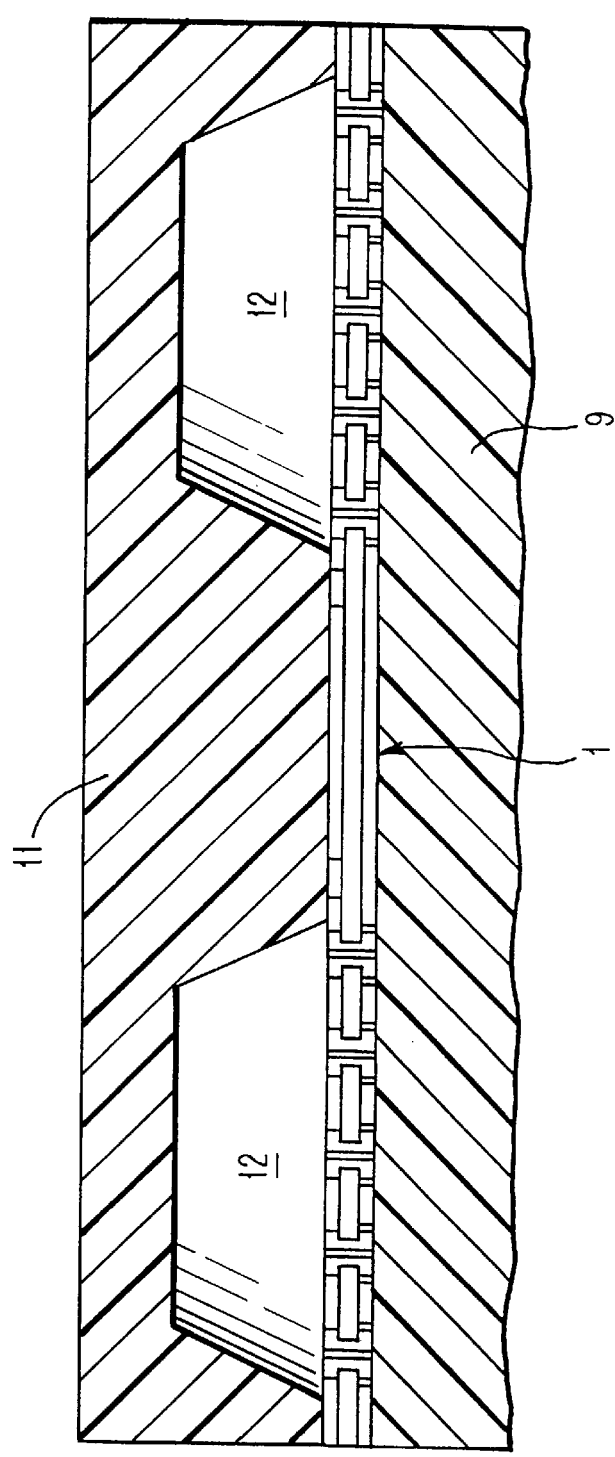
FIG.1
FIG.2

METHOD FOR FABRICATING AN ELECTRONIC PACKAGE

TECHNICAL FIELD

The present invention is concerned with a method for forming an electronic package and is especially concerned with forming a package that includes a semiconductor device such as a chip attached to a thin flexible film. The present invention is especially concerned with producing TBGA (tape ball grid arrays) packages. More particularly, the present invention is concerned with a method for providing a TBGA carrier, or substrate, with a stiffener for facilitating subsequent handling.

BACKGROUND ART

In the manufacture of printed circuit boards and cards a dielectric sheet material is employed as the substrate. A conductive circuit pattern is provided on one or both of the major surfaces of the substrate.

As described in, for instance, U.S. Pat. No. 3,689,991, and Tummala, "Microelectronics Packaging Handbook," pages 409–439, Van Nostrand Rhinehold, disclosures of which are incorporated herein by reference, flexible polymeric films can be used as carriers in the packaging of semiconductor chips such as in the so-called TAB (tape automated bonding) procedure. To date, the primary polymeric materials employed for such have been the polyimides.

The tape automated bonding technique involves bonding the tip ends of the leads formed in a selected pattern on a TAB tape to the electrodes of an IC chip via metallic bonding projections called bumps. In addition, solder bumps or balls may be used to connect the TAB tape to the connective pads on an integrated circuit board or card.

In order to handle the thin flexible film and protect it from damage during subsequent processing, TBGA films require a stiffener for support. Typically, the stiffener is constructed of metal, which is stamped so as to keep costs at a minimum. The stiffener is then attached using an adhesive to the thin flexible film layer. This attaching process however is somewhat costly. Moreover, some problems exist in handling the adhesive since such can absorb moisture which in turn can result in corrosion, "popcorning" or shorts between signal traces. Accordingly, there remains room for improvement in thin, flexible film technology.

SUMMARY OF INVENTION

The present invention provides a method for forming an electronic package that overcomes above discussed problems in the prior art concerning attachment of the stiffener means to the thin, flexible film layer. In particular, according to the present invention, a plastic dielectric body is applied directly to one side of a thin film of the TBGA substrate or carrier prior to attaching the semiconductor device, such as the integrated circuit chip. More particularly, the method of the present invention involves providing a thin, circuitized substrate having electrical conductivity on a first surface thereof. Next, a dielectric body is molded to the first surface of the thin circuitized substrate. The dielectric body includes an opening therein to thereby expose a portion of the surface of the thin circuitized substrate having at least part of the electrical circuitry thereon.

Thereafter, the method of the present invention includes positioning a semiconductor device within the opening in the molded dielectric body and electrically coupling the device to at least part of the electrical circuitry on the exposed portion of the surface of the thin circuitized substrate. Subsequently, a plurality of electrical conductive members are secured to the surface of the thin circuitized substrate that is opposite the first surface.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

SUMMARY OF DRAWINGS

FIGS. 1–6 are schematic cross-sectional diagrams of the electronic package in various stages of fabrication according to the method of the present invention.

BEST AND VARIOUS MODES FOR CARRYING OUT INVENTION

Figure 3:
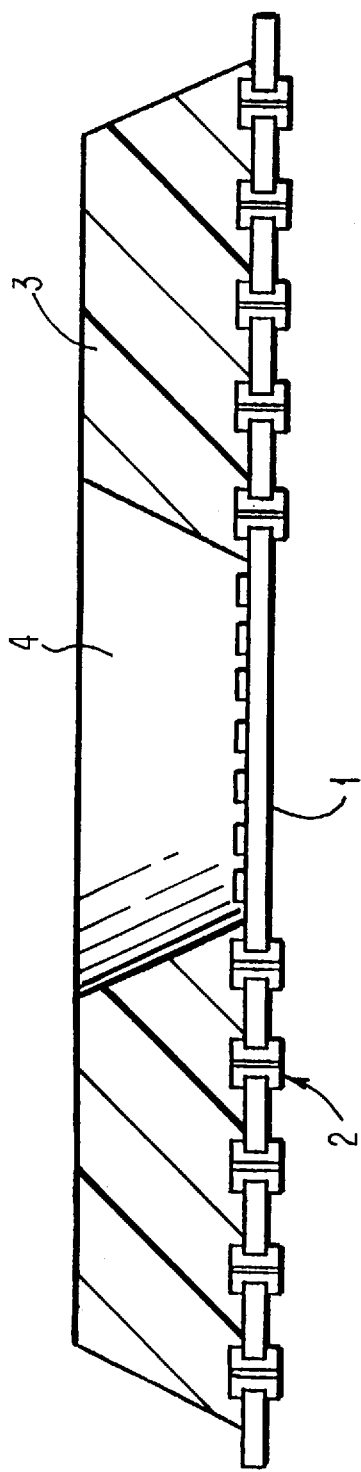

In order to facilitate an understanding of the present invention, reference will be made to the various figures. In particular, FIG. 1 is a schematic cross-sectional diagram illustrating a flexible circuit comprising a dielectric 1, desired circuitry 2, a solder mask 8 and wire bond pads 10. The flexible circuit is positioned on the lower half of a transfer mold 9. However, it is understood that both transfer molding, as well as injection molding can be employed, with transfer molding being the preferred method because of its ready availability. The preferred dielectric 1 is a polyimide film as known in the prior art. The film is typically less than about 0.5 mm, and preferably about $25\mu$ to about $100\mu$. The circuitry 2 can be provided by any of the methods available and well known.

FIG. 2 illustrates clamping the flexible circuit 1 between the lower 9 half and upper 11 half of the mold with cavity 12. The plastic molding composition is then directly provided in the cavity 12 and to only one side, in the example shown, the top side, of flexible circuit 1. It is essential to the practice of the present invention that the plastic mold material be applied to only one of the major surfaces of the flexible circuit 1. Otherwise, material provided on the other major surface of the film has a tendency to reduce the available area for connection to integrated circuit boards or chips, such as through BGA (solder balls).

The materials used for transfer molding should desirably have a CTE that can be matched to that of the flexible polyimide film, the card to which the module may subsequently be attached, or to some intermediate value between that of the chip and polyimide. Typically, the polymeric material has a CTE of between about 12 to about 25 ppm/°C. and includes such thermosetting materials as epoxy resin based materials, such as Toshiba XKE-6000 and various liquid crystal polymers, such as polyesters, polyethers, polysiloxanes, and α-poly-p-xylylene. The epoxy resin based compositions are preferred and being thermosetting withstand reflow at the temperatures to which the package is subsequently subjected. The particular molding composition can be tailored to the specific requirements of the electronic device. Along these lines, the fatigue life of the traces between the integrated circuit chip and the ball grid array can be lengthened by using a relatively low expansion material. The BGA fatigue life can be lengthened by increasing the CTE of the plastic molding composition. In addition, the epoxy compositions can include known fillers for reinforcement if desired.

FIG. 3 illustrates the flexible circuit 1 having the molded stiffener 3 after release from the mold and prior to detachment, and illustrating the opening 4. The molded stiffener 3 as illustrated in FIG. 3 does not extend beneath the film 1. The stiffener makes it possible to handle the flexible film in strips, rolls or small panels. Also, as apparent, the use of the molded stiffener directly onto the flexible thin film avoids the necessity of an adhesive composition.

Figure 4:
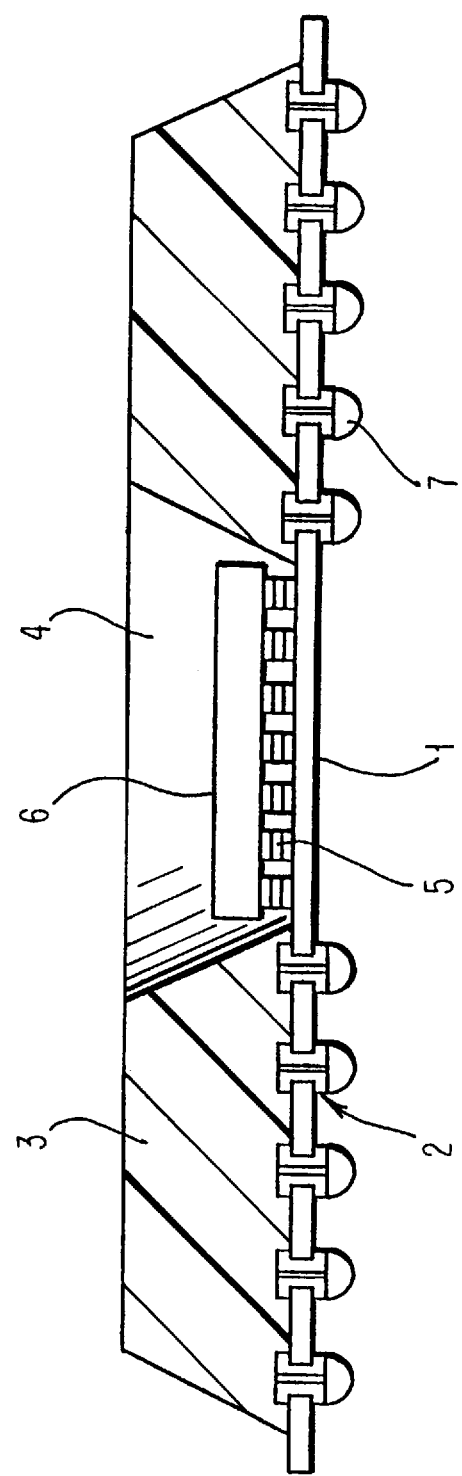

FIG. 4 illustrates a flip-chip BGA application of the present invention. Subsequent to providing the molded stiffener 3, the semiconductor 6 is positioned within the opening 4 in the molded stiffener and is electrically connected or coupled to electrical circuitry on the film 1. One method of connecting the semiconductor device or integrated circuit chip is to use a solder reflow technique to form interconnections 5. However, it is understood that in place of solder interconnections other methods of wiring, such as using wire bonding can be employed. Also shown in this figure are tapers on the sides of opening 4 and on the periphery of the stiffener 3 to facilitate removal from the mold. The figure also shows balls or bumps 7 that are provided on the surface of the substrate 1 opposite to that surface having the stiffener 3.

Figure 5:
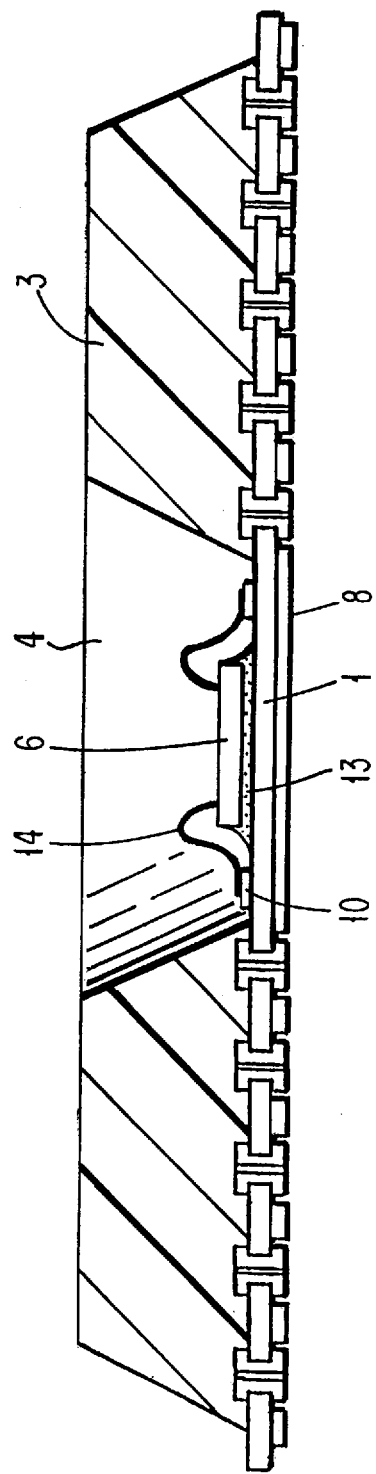

FIG. 5 illustrates an alternative technique for bonding the semiconductor device using a wire-bond technique. In particular, electrically conductive pads, such as copper pads 10 are provided on the flexible film 1, and electrically conductive wire loops 14 electrically connect the chip 6 to the pads. An adhesive 13 can be employed to attach the chip to the substrate 1.

Figure 6:
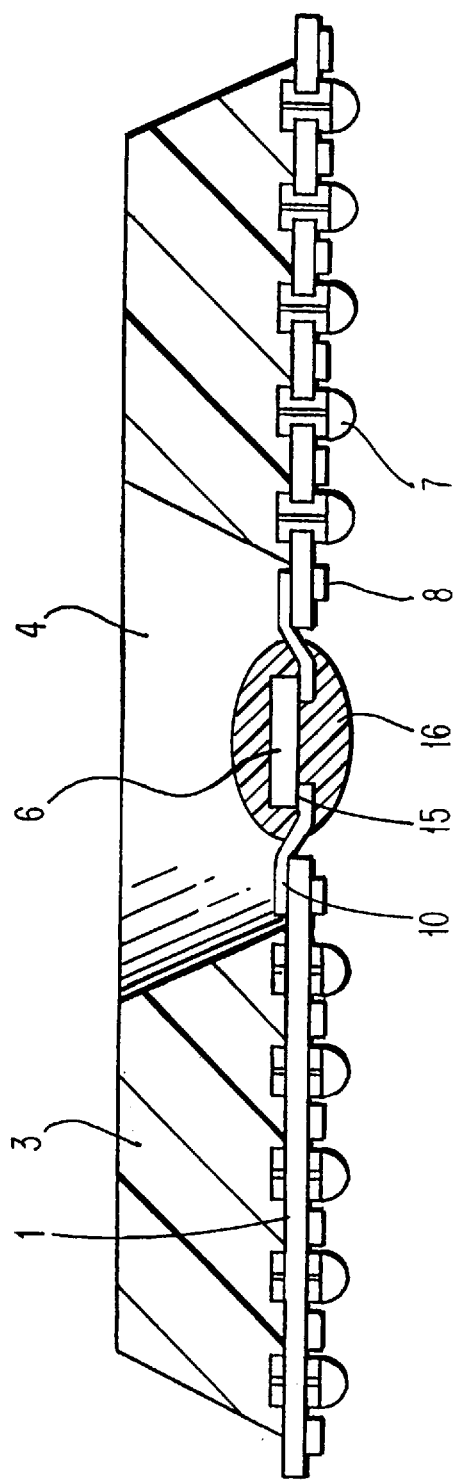

A still further technique of attaching the integrated circuit chip to the film is shown in FIG. 6 whereby a thermal-compression bond 15 is employed. The leads 10 from the chip to the film are encapsulated with an encapsulant 16 that can be provided.

In addition, if desired, a heat sink can be attached directly to the chip in order to enhance its thermal performance. In addition, when using the flip-chip method, the package would not require any further encapsulation. However, with wire-bonding, the wires should desirably be encapsulated by filling the cavity around the chip with a plastic resin composition or by a secondary molding process.

The molded-plastic to polyimide interface resists delamination even after thermal cycling and subsequent processing. The molding is generally carried out in about 5 seconds to about 10 seconds, at 170° to 180° C. and pressure of about 50 to about 100 kg/mm², with final cure being carried out at a temperature of about 170° to about 180° C., typical of which is about 175° C. for about 2 to about 8 hours, typically of which is about 4 hours.

Figure 7:
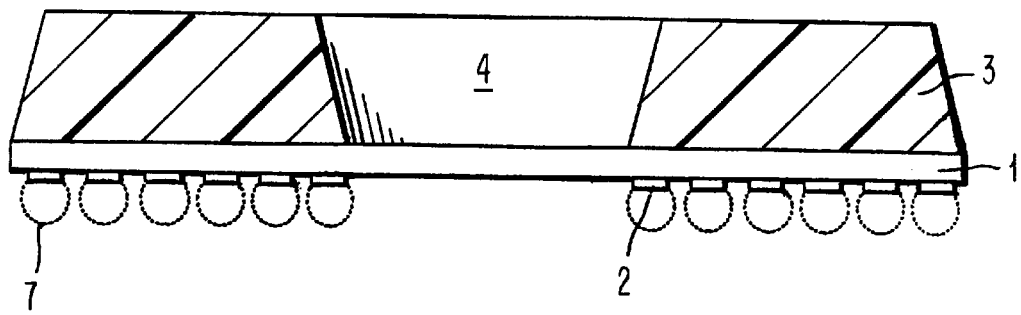
FIG. 7 is a cross-sectional view of a molded TBGA prepared in accordance with the present invention.

FIG. 7 illustrates a cross section of a molded TBGA pursuant to the present invention prior to attachment of the integrated circuit chip and after attachment of solder balls or bumps 7.

Figure 8:
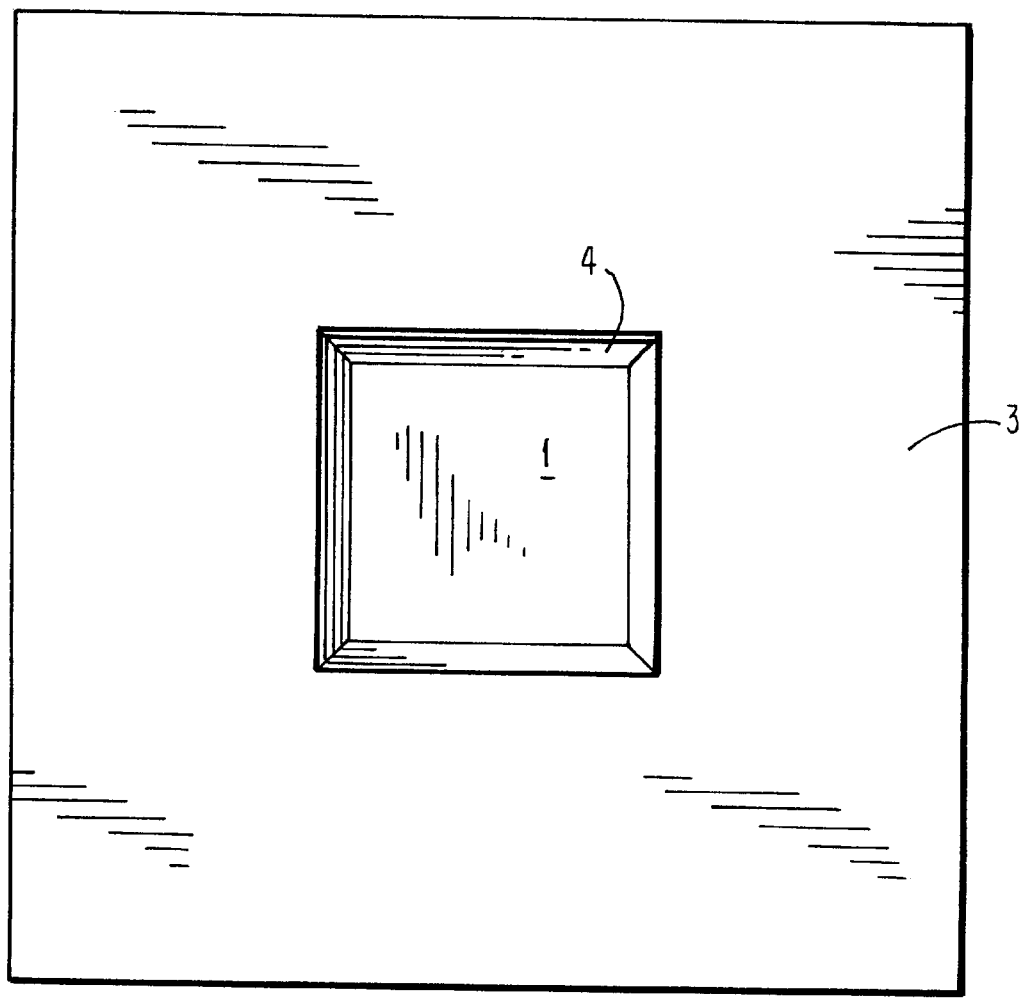
FIG. 8 is a top view of a molded TBGA prepared in accordance with the method of the present invention.

FIG. 8 illustrates a top view of the molded TBGA illustrated in FIG. 7.

In this disclosure, there are shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. A method of forming an electronic package comprising the steps of:

providing a thin, circuitized substrate having electrical circuitry on a first surface thereof wherein said circuitized substrate is a flexible thin circuitized film;

molding a dielectric stiffener body to said first surface of said thin, circuitized substrate for supporting the thin circuitized substrate and for facilitating subsequent handling of the package wherein said dielectric stiffener body includes an opening therein to thereby expose a portion of said surface of said thin, circuitized substrate having at least part of said electrical circuitry thereon;

positioning a semiconductor device within said opening within said molded dielectric stiffener body in electrically coupling said device to said at least part of said electrical circuitry on said exposed portion of said surface of said thin, circuitized substrate; and securing a plurality of electrical conductive members to an opposite surface of said thin, circuitized substrate.

2. The method of claim 1 wherein said circuitized substrate is a polyimide.

3. The method of claim 1 wherein said molding is transfer molding.

4. The method of claim 1 wherein said molding is injection molding.

5. The method of claim 1 wherein said opening is tapered inwardly in the direction of said thin, circuitized substrate.

6. The method of claim 1 wherein said semiconductor device is electrically coupled to said at least part of said electrically circuitry by C4 bond.

7. The method of claim 1 wherein said electrically coupling of said device is by wire bonding.

8. The method of claim 1 wherein said electrically coupling of said device is by TC bonding.

9. The method of claim 1 wherein said opposite surface of said thin, circuitized substrate is not molded with said dielectric body.

10. The method of claim 1 wherein said dielectric body is based upon epoxy resin.

11. The method of claim 1 wherein said dielectric body has a CTE of about 12 to about 25 ppm/°C.

12. The method of claim 1 wherein said molding is carried out at a temperature of about 170 to about 180, under a pressure of about 50 to about 100 kg/mm².

13. The method of claim 1 wherein said molding is carried out in about 5 to about 10 seconds.

14. The method of claim 1 whereby said dielectric body is not subsequently encapsulated.

15. The method of claim 1 wherein said electrical conductive members include solder balls spacedly positioned on said opposite surface.

16. The method of claim 15 which further includes providing plated through holes through said thin, flexible substrate before molding said dielectric body to said first surface.

17. The method of claim 1 which further comprises positioning a heat sink in thermal contact with said dielectric body.

18. The method of claim 1 wherein said substrate is a dielectric film having a thickness less than about 0.5 mm.

19. The method of claim 1 wherein said substrate is a dielectric film having a thickness of about 25μ to about 100μ.

20. The method of claim 1 wherein said substrate is a polyimide film.

\* \* \* \* \*